(12) United States Patent
Varadarajan et al.

(10) Patent No.: US 6,937,104 B1
(45) Date of Patent: Aug. 30, 2005

(54) HIGH SPEED HIGH CURRENT GAIN OPERATIONAL AMPLIFIER

(75) Inventors: Devnath Varadarajan, Santa Clara, CA (US); Laurence D. Lewicki, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/668,364

(22) Filed: Sep. 22, 2003

Related U.S. Application Data (63) Continuation of application No. 10/000,194, filed on Oct. 25, 2001, now Pat. No. 6,624,704.

(51) Int. Cl.[7] .................................................. H03F 3/04
(52) U.S. Cl. .......................................... 330/311; 330/98
(58) Field of Search ........................... 330/98, 99, 100, 330/292, 303, 310, 311

(56) References Cited

U.S. PATENT DOCUMENTS

| | | | | |
|---|---|---|---|---|
| 4,030,043 A | | 6/1977 | Hamilton | |
| 4,183,020 A | * | 1/1980 | Schade, Jr. | 340/629 |
| 4,354,163 A | * | 10/1982 | Kato | 330/293 |
| 4,358,739 A | * | 11/1982 | Nelson | 330/255 |
| 4,453,132 A | | 6/1984 | Stamler | |
| 4,453,134 A | | 6/1984 | Pernyeszi | |
| 4,539,491 A | | 9/1985 | Nishioka et al. | |
| 4,783,602 A | | 11/1988 | Viswanathan | |
| 4,973,917 A | | 11/1990 | Johnson | |
| 6,281,752 B1 | | 8/2001 | Stochino | |

\* cited by examiner

Primary Examiner—Henry Choe (57) ABSTRACT

An operational amplifier having a low impedance input and a high current gain output. The operational amplifier comprises: 1) a first N-channel transistor having a source coupled to the low impedance input of the operational amplifier; 2) a first constant current source coupled between the source of the first N-channel transistor and ground; 3) a first amplifier stage having an input coupled to the first N-channel transistor source and an inverting output coupled to a gate of the first N-channel transistor; 4) a second amplifier stage having an input coupled to a drain of the first N-channel transistor and an output coupled to the high current gain output of the operational amplifier; and 5) an internal compensation capacitor coupled between the input and the output of the second amplifier stage.

20 Claims, 6 Drawing Sheets

HIGH SPEED HIGH CURRENT GAIN OPERATIONAL AMPLIFIER

This application is a continuation of prior U.S. patent application Ser. No. 10/000,194 filed on Oct. 25, 2001, now U.S. Pat. No. 6,624,724.

TECHNICAL FIELD OF THE INVENTION

The present invention is directed, in general, to operational amplifiers and, more specifically, to a high current gain operational amplifier for driving low impedance wires in a local area network (LAN).

BACKGROUND OF THE INVENTION

The rapid proliferation of local area network (LANs) in the corporate environment and the increased demand for time-sensitive delivery of messages and data between users has spurred development of high-speed (gigabit) Ethernet LANs. The 100BASE-TX Ethernet LANs using category-5 (CAT-5) copper wire and the 1000BASE-T Ethernet LANs capable of one gigabit per second (1 Gbps) data rates over CAT-5 data grade wire require new techniques for the transfer of high-speed data symbols.

A 1000BASE-T Ethernet LAN driver requires an operational amplifier (opamp) capable of driving low impedance loads (i.e., 50 ohm transmission lines) with a large signal swing and high linearity. In order to reduce high frequency energy, the data signal must also be low-pass filtered to 90 MHz. In conventional operational amplifier applications, this means that the opamp used in the filter must have a unity gain frequency which is much higher than 90 MHz. In order to achieve such a high unity gain bandwidth, a conventional opamp operates using a large amount of current (i.e., high power consumption). The high unity gain frequency also makes it difficult to stablize the operational amplifier and it usually suffers from poor phase margins. The operational amplifier also undergoes a degradation in the unity gain bandwidth due to the presence of an input pole in the feedback path.

Therefore, there is a need in the art for an improved operational amplifier that consumes less current when driving a low impedance transmission line. In particular, there is a need in the art for an operational amplifier that does not require a unity gain bandwidth that is much larger than the low-pass filtered frequency band of the transmission line. More is particularly, there is a need in the art for an operational amplifier that eliminates the input pole in the feedback path.

SUMMARY OF THE INVENTION

The limitations inherent in the prior art described above are overcome by the present invention which provides an operational amplifier having a low impedance input and a high current gain output. According to an advantageous embodiment of the present invention, the operational amplifier comprises: 1) a first N-channel transistor having a source coupled to the low impedance input of the operational amplifier; 2) a first constant current source coupled between the source of the first N-channel transistor and ground; 3) a first amplifier stage having an input coupled to the first N-channel transistor source and an inverting output coupled to a gate of the first N-channel transistor; 4) a second amplifier stage having an input coupled to a drain of the first N-channel transistor and an output coupled to the high current gain output of the operational amplifier; and 5) an internal compensation capacitor coupled between the input and the output of the second amplifier stage.

According to one embodiment of the present invention, the operational amplifier further comprises a second constant current source coupled between the drain of the first N-channel transistor and a positive power supply.

According to another embodiment of the present invention, the first amplifier stage comprises a second N-channel transistor having a gate coupled to the source of the first N-channel transistor, a source coupled to ground, and a drain coupled to the inverting output of the first amplifier stage.

According to still another embodiment of the present invention, the drain of the second N-channel transistor is further coupled to a third constant current source.

According to yet another embodiment of the present invention, the second amplifier stage comprises a third N-channel transistor having a gate coupled to the input of second amplifier stage, a source coupled to a fourth constant current source, and a drain coupled to the positive power supply.

According to a further embodiment of the present invention, the second amplifier stage comprises a fourth N-channel transistor having a gate coupled to the source of the third N-channel transistor, a source coupled to ground, and a drain coupled to the output of the second amplifier stage.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention, reference is now made to the following descriptions taken in conjunction with the accompanying drawings, in which.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged operational amplifier.

The present invention proposes a new scheme for producing operational amplifiers with a high unity gain frequency. The new operational amplifier uses an active virtual ground input to provide a low input impedance to reduce bandwidth limitations due to the input pole of the operational amplifier. The input current is conveyed to a high impedance point to achieve a large open loop DC gain. The voltage produced at the high impedance point is buffered to drive a transconductance output stage. The transconductance output stage is biased by an external resistive load. This ensures that the output stage has more current drive capacity when it is driving lower impedance loads and makes the gain in the second stage of the operational amplifier less sensitive to the external resistive load variations. The new amplifier also enables a configuration where the compensation capacitor can be used to limit the bandwidth of the closed loop response when the operational amplifier is used as a part of a lowpass filter. The new configuration provides low pass filters which have very good stability and phase margin.

According to an advantageous embodiment, the present invention may be implemented as an operational amplifier having a low impedance input and a high current gain output, wherein the operational amplifier comprises: 1) an first N-channel transistor having a source coupled to the low impedance input of the operational amplifier; 2) a first constant current source coupled between the source of the first N-channel transistor and ground; 3) a first amplifier stage having an input coupled to the first N-channel transistor source and an inverting output coupled to a gate of the first N-channel transistor; 4) a second amplifier stage having an input coupled to a drain of the first N-channel transistor and an output coupled to the high current gain output of the operational amplifier; and 5) an internal compensation capacitor coupled between the input and the output of the second amplifier stage.

The present invention may be implemented as an operational amplifier that functions as a 90 MHz low pass filter without requiring a unity gain frequency that is much greater than 90 MHz. This results in operation with a lower supply current and reduced power consumption.

Figure 1:
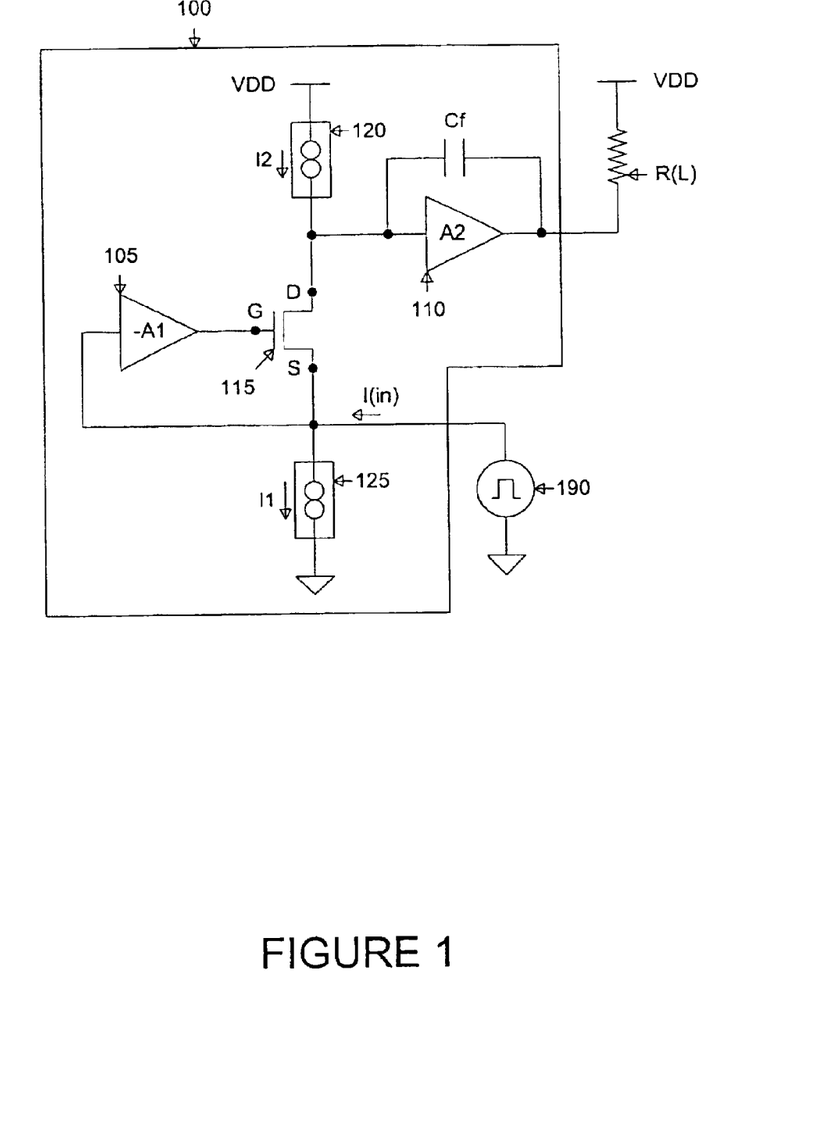
FIG. 1 illustrates a high current gain operational amplifier according to an exemplary embodiment of the present invention.

FIG. 1 illustrates high current gain operational amplifier 100 according to an exemplary embodiment of the present invention. High current gain operational amplifier 100 comprises amplifier stage 105, amplifier stage 110, N-channel transistor 115, constant current source 120, constant current source 125, and internal compensation capacitor CL. AC signal source 190 applies an input current, I(in), to operational amplifier 100, which drives a load resistor, R(L). Under DC conditions, the DC current, I2, in constant current source 120 flows from the drain (D) to the source (S) of N-channel transistor 115 and is equal to the DC current, I1, in constant current source 125.

The input current, I(in), from AC signal source 190 causes a voltage change at the source of N-channel transistor 115. Amplifier stage 105 is an inverting amplification stage that has gain of −A1. The voltage change at the source of N-channel transistor 115 is therefore amplified and inverted at the gate (G) of N-channel transistor 115. Hence, a voltage increase at the source of N-channel transistor 115 causes a larger voltage decrease at the gate of N-channel transistor 115. This, in turn, reduces current flow through the drain of N-channel transistor 115. Since the current, I1, from constant current source 125 remains unchanged, the current flowing into amplifier stage 110 and capacitor Cf increases. Similarly, a voltage decrease at the source of N-channel transistor 115 results in a current decrease into amplifier stage 110 and capacitor Cf.

In order to push out the poles normally associated with the gate capacitance of a standard differential pair, operational amplifier 100 is implemented with low impedance input stage. This is achieved by a gain boosting stage consisting of amplifier stage 105 and N-channel transistor 115 and constant current sources 120 and 125. The input impedance, Zin, seen by the input current, I(in), at the source of N-channel transistor 115 is given by the equation:

$$Zin=[1/(gm \times A1)] \times [1+(rds/Ro)],$$

where:

gm is the transconductance of N-channel transistor 115;

rds=1/gds;

gds is the output conductance of N-channel transistor 115; and

Ro is the output impedance of constant current source 120.

From the expression for the input impedance, Zin, it is seen that increasing the gain A1 of amplifier stage 105 reduces the input impedance, Zin. Thus, by providing a large gain for A1, a very low input impedance can be achieved. The low input impedance pushes the input pole (due to the parasitic capacitors present at the input) to a very high frequency. This removes the bandwidth degradation seen in the feedback loop due to the input pole.

A high impedance point occurs at the junction point of the rain of N-channel transistor 115 and constant current source 120. The input current is made to flow into this high impedance point in order to get a large voltage.

Figure 2:
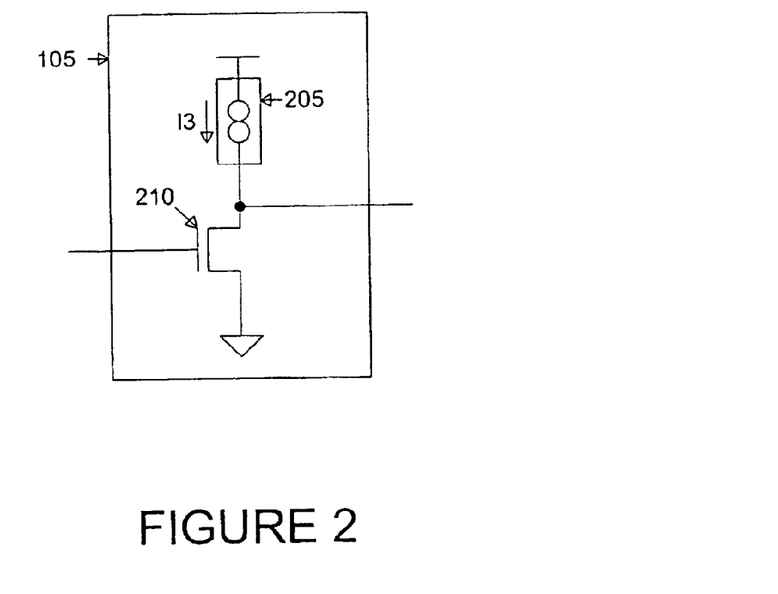
FIG. 2 illustrates in greater detail a first amplifier stage of the high current gain operational amplifier in FIG. 1 according to an exemplary embodiment of the present invention.

FIG. 2 illustrates amplifier stage 105 of high current gain amplifier 100 in greater detail according to an exemplary embodiment of the present invention. Amplifier stage 105 comprises N-channel transistor 210 and constant current source 205, which has a DC current, I3. Increasing the voltage at the input (i.e., gate of N-channel transistor 210) of amplifier stage 105 reduces current flow through N-channel transistor 210, thereby reducing the voltage at the output (i.e., drain of N-channel transistor 210) of amplifier stage 105. Similarly, decreasing the voltage at the input of amplifier stage 105 increases current flow through N-channel transistor 210, thereby increasing the voltage at the output of amplifier stage 105. Thus, the gain, A1, of amplifier stage 105 is implemented by a common source stage.

Figure 3:
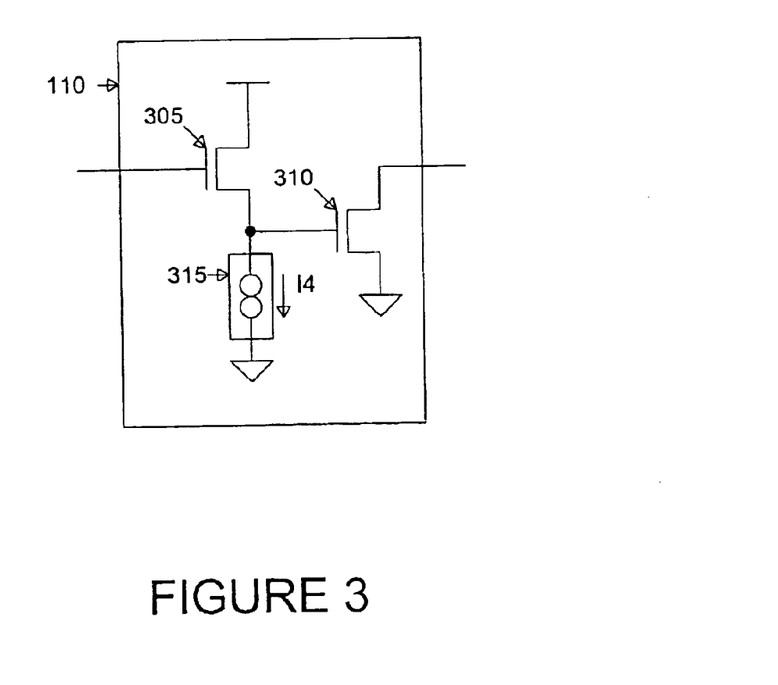
FIG. 3 illustrates in greater detail a second amplifier stage of the high current gain operational amplifier in FIG. 1 according to an exemplary embodiment of the present invention.

FIG. 3 illustrates amplifier stage 110 of high current gain amplifier 100 in greater detail according to an exemplary embodiment of the present invention. Amplifier stage 110 comprises N-channel transistor 305, N-channel transistor 310, and constant current source 315, which has a DC current, I4. Increasing the voltage at the input (i.e., gate of N-channel transistor 305) of amplifier stage 110 increases current flow through N-channel transistor 305, thereby increasing the voltage at the gate of N-channel transistor 310. This in turn increases the current flow through the drain of N-channel transistor 310, which reduces the voltage at the output (i.e., drain of N-channel transistor 310) of amplifier stage 110. Similarly, decreasing the voltage at the input of amplifier stage 110 decreases the voltage at the output of amplifier stage 110. In sum, amplifier stage 110 operates as an inverting amplifier.

Amplifier stage 110 implements the buffer stage and the output transconductance stage. The buffer stage consists of a source follower (i.e., N-channel transistor 305 and constant current source 315) and the output stage (i.e., N-channel transistor 310) is a common source stage. The output stage is biased using the external load resistor, R(L), which may also provide termination when transmission lines are used. Thus, the current in the output stage increases when it has to drive low impedance loads. This provides power saving when the circuit has to drive large impedance loads and gives the circuit extra drive capability when it has to drive low impedance loads. It also makes the gain in the output stage less sensitive to external load variations.

In order to minimize spectrum and interference from adjacent channels, most communication circuits require the signal to be bandwidth limited. This usually means that an operational amplifier is part of a low pass filter. The usual configuration of a low pass filter comprises an opamp with a feedback resistor and a feedback capacitor connected in parallel between the output and the inverting input of the opamp, with the non-inverting input of the opamp grounded. This configuration requires the unity gain frequency of the opamp to be much greater than the low-pass cutoff frequency. If the low-pass cutoff frequency is large (i.e., 100 MHz or more), then the requirement on the opamp unity gain frequency becomes very difficult to achieve (i.e., 600 MHz or above). A conventional operational amplifier designed to meet these specifications consumes a lot of current in order to achieve such large bandwidths. This raises the power consumption of the opamp to unacceptable levels.

Figure 4:
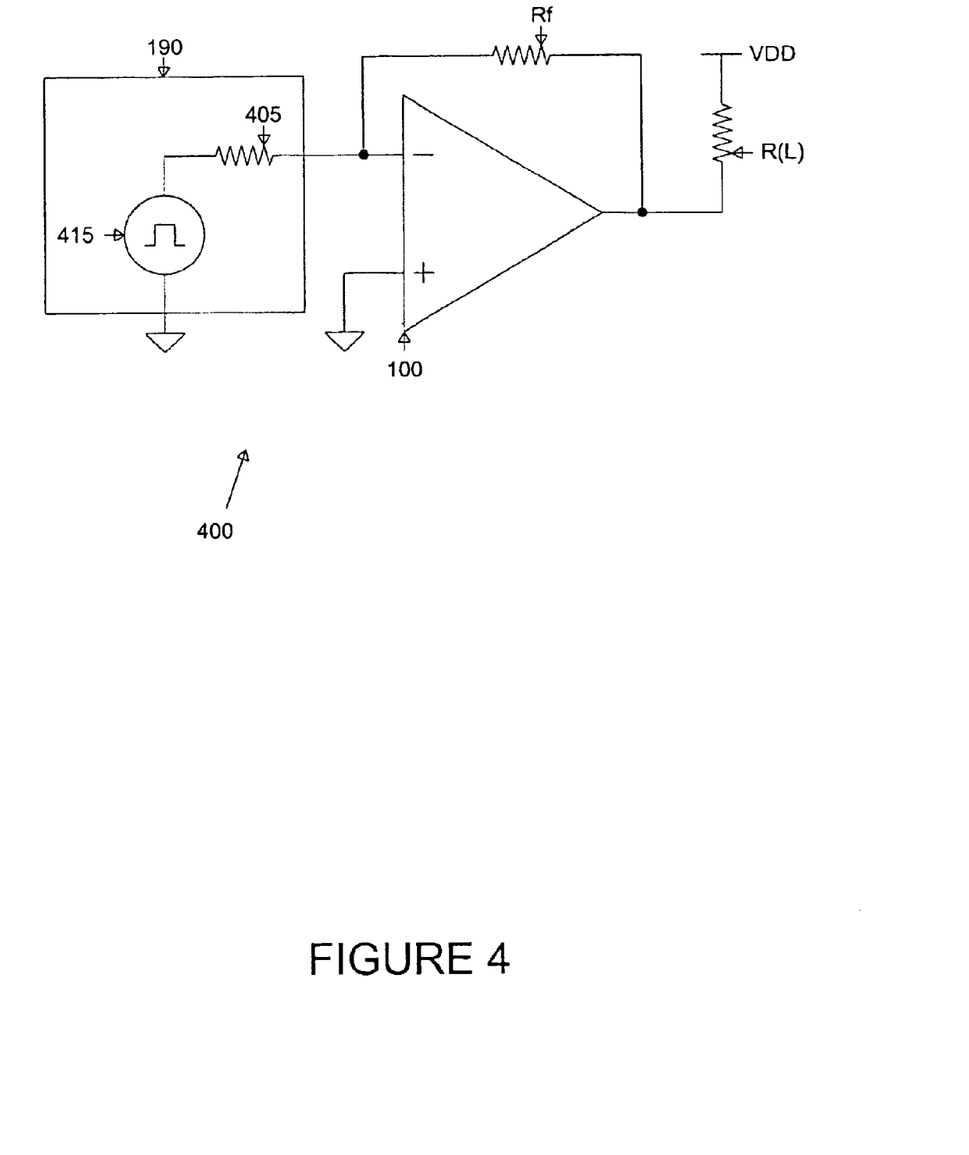
FIG. 4 illustrates a low-pass filter that implements a high current gain amplifier in accordance with the principles of the present invention.

FIG. 4 illustrates low-pass 400, which contains high current gain operational amplifier 100 in accordance with the principles of the present invention. AC signal source 190 comprises signal generator 415 and resistor 405. Operational amplifier 400 also comprises feedback resistor Rf and drives load resistor R(L). It is noted that, unlike a conventional low-pass filter, low pass filter 400 does not include an external feedback capacitor between the output and the inverting input of operational amplifier 100.

Figure 5:
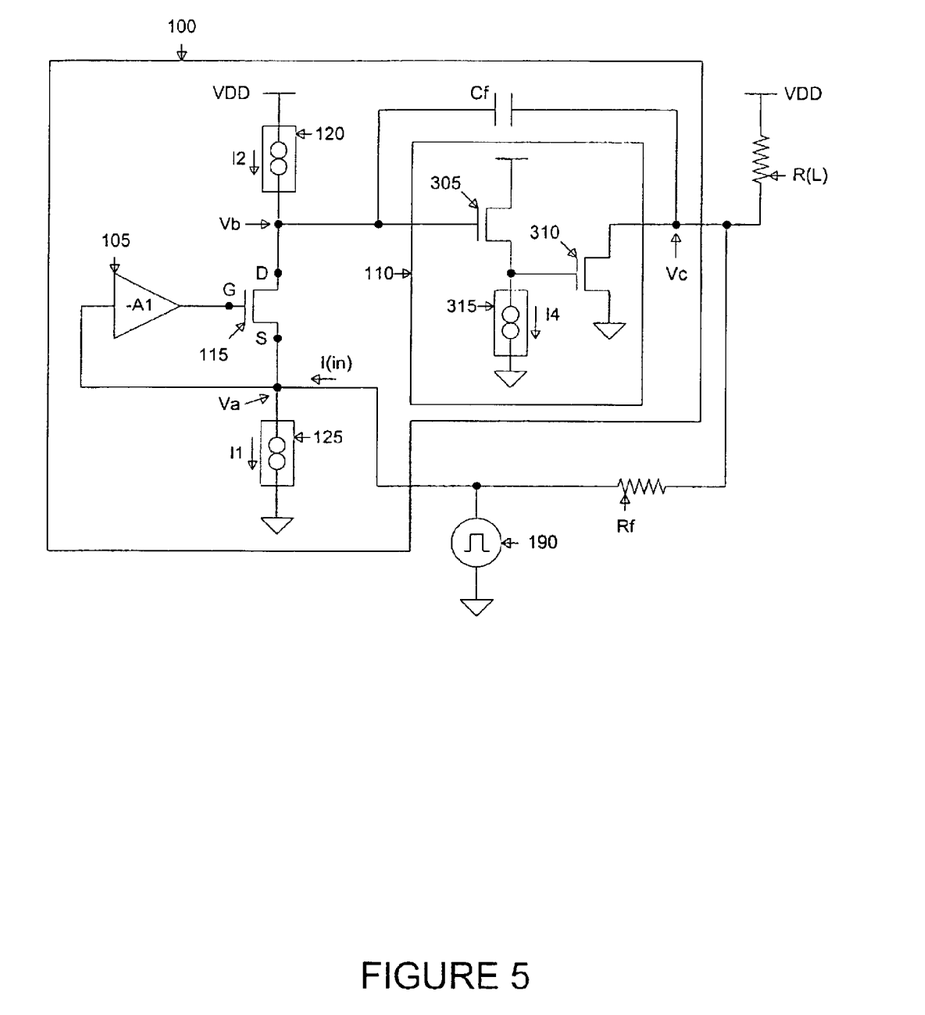
FIG. 5 illustrates in greater detail the low-pass filter in FIG. 4 according to an exemplary embodiment of the present invention.

FIG. 5 illustrates low-pass filter 400 in greater detail. In the proposed configuration, the internal compensation capacitor, Cf, between the input and the output of amplifier stage 110 can be used as the low-pass filter capacitor. Internal compensation capacitor Cf gets Miller multiplied and provides the dominant pole of operational amplifier 100 at the high impedance point at the junction point of the drain of N-channel transistor 115 and constant current source 120. The cutoff frequency, F(co), of low-pass filter 400 is given by $F(co)=1/[2\pi(Rf)(Cf)]$, where Cf is the internal compensation capacitor.

The equations below shown that, in this configuration, the unity gain frequency of operational amplifier 100 has to be only as great as the low pass cutoff frequency, not several times the low pass cutoff frequency, as required by the prior art. This reduced requirement on the unity gain frequency of operational amplifier 100 implies that operational amplifier 100 burns much less current, which translates into lower power consumption.

Gain and Bandwidth Calculations
1. Open Loop Calculations—
DC gain—The input is assumed to be a current of magnitude I(in). The impedance of the input stage is assumed to be Zin. The output impedance of the current source is assumed to be Ro. The load impedance is R(L). Voltages at Va, Vb, and Vc are:
Va=I(in)(Zin)
Vb=I(in)(Ro)
Vc=I(in)(Ro)(a)(gm)(RL), where a is the gain of the source follower and gm is transconductance of the output stage.

$$\text{Loop Gain}=Ro(a)(gm)(R(L)/(Rf)) \qquad \text{(Equation 1)}$$

Dominant Pole
  Miller cap=Cf(a)(gm)(R(L))

$$\text{Dominant pole}=1/(Ro(Cf)(a)(gm)(R(L))) \qquad \text{(Equation 2)}$$

Gain Bandwidth
  From Equations 1 and 2:
  Gain Bandwidth Product=1/[(Rf)(Cf)]
2. Closed Loop Calculations—
  From the open loop calculations we get:
Va=I(in)(Zin)
Vb=I(in) [Ro/[1+s(Cf)(Ro)(a)(gm)(R(L))]]
Vc=I(in) [Ro(a)(gm)(R(L))]/[1+s(Cf)(Ro)(a)(gm)(R(L))]

$$\text{Loop Gain}=[Ro(a)(gm)(R(L)/Rf)]/[1+s(Cf)(Ro)(a)(gm)(R(L))]) \qquad \text{(Equation 3)}$$

From Equations 2 and 3, the closed loop transfer function is:

$$Vc/I(in)=X/Y, \text{ where}$$

X=[Ro(a)(gm)(R(L)]/[1+s(Cf)(Ro)(a)(gm)(R(L))]; and
Y=1+[Ro(a)(gm)(R(L)/Rf))]/[1+s(Cf)(Ro)(a)(gm)(R(L))].
This reduces to Vc/I(in)=W/Z, where
W=[Ro(a)(gm)(R(L))]Rf; and
Z=Rf+Ro(a)(gm)(R(L))+s(Cf)(Ro)(a)(gm)(R(L)(Rf).
Assuming Ro(a)(gm)(R(L))>>Rf, this simplifies to:

$$Vc/I(in)=S/T, \text{ where}$$

S=[Ro(a)(gm)(R(L)(Rf)]
T=[Ro(a)(gm)(R(L)+s(Cf)(Ro)(a)(gm)(R(L))(Rf)]
Canceling common terms from the numerator and denominator yields:

$$Vc/I(in)=Rf/[1+s(Cf)(Rf)] \qquad \text{(Equation 4)}$$

Figure 6:
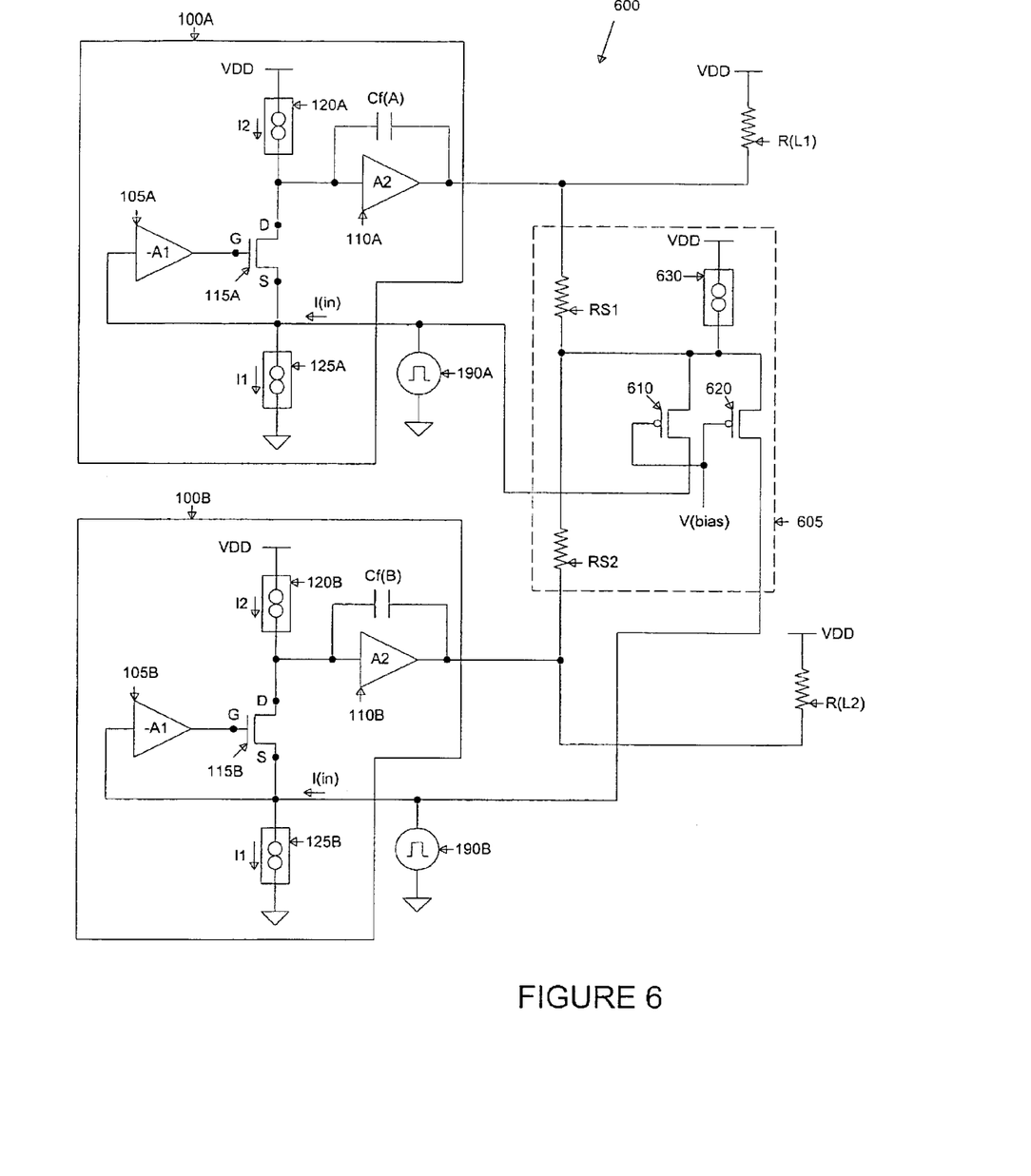
FIG. 6 illustrates a differential amplifier using two high current gain operational amplifiers according to the principles of the present invention.

FIG. 6 illustrates differential amplifier 600 using two high current gain amplifiers according to the principles of the present invention. Many communication circuits require differential signaling. A differential amplifier may be implemented using two high current gain operational amplifiers 100A and 100B, as shown in FIG. 6, along with common mode rejection circuit 605. Common mode rejection circuit 605 removes any common mode noise present at the output in order to give purely differential signals.

Common mode rejection circuit 605 comprises two sense resistors, RS1 and RS2, which sense the common mode noise, P-channel transistors 610 and 620, and constant current source 630. The common node of resistors RS1 and RS2 is connected to the common gate amplifier formed by transistors 610 and 620, which is biased in order to set the output common level. This converts the common mode voltage to a common mode current. This common mode current is fed back to the inputs of operational amplifiers 100A and 100B. Thus, the common mode circuit employs the same amplifier for the differential and the common mode paths. This makes the design small because the same compensation network is used for both the differential and the common mode paths.

Figure 7:
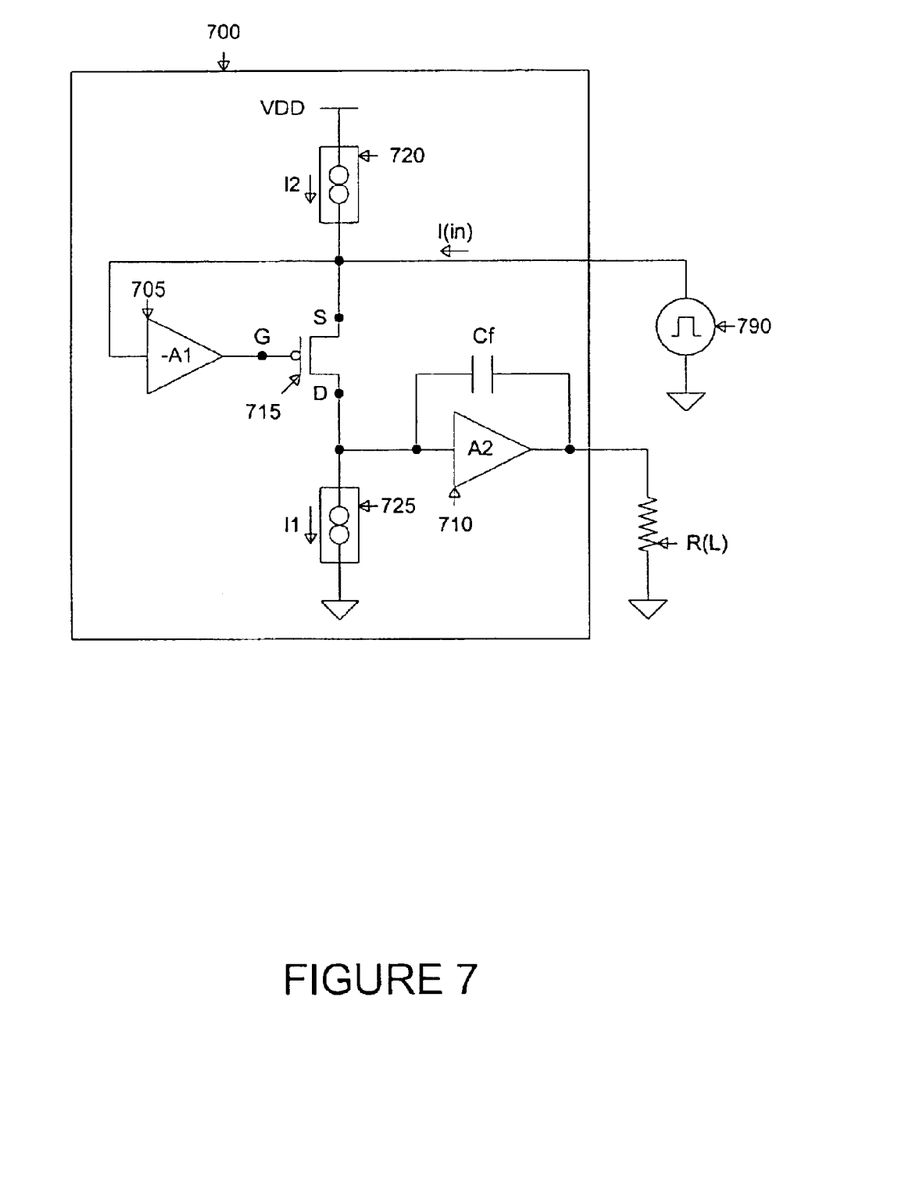
FIG. 7 illustrates a high current gain operational amplifier according to an alternate embodiment of the present

FIG. 7 illustrates high current gain operational amplifier 700 according to an alternate embodiment of the present invention. Operational amplifier 700 differs from operational amplifier 100 in FIG. 1 in that N-channel transistors have been replaced with P-channel transistors. This correspondingly necessitates the re-arrangement of the other elements of operational amplifier 700 in order to compensate for the change to a P-channel device. As FIG. 7 illustrates, the source of P-channel transistor 715 is now coupled to the positive power supply, VDD via constant current source 720, and the drain of P-channel transistor 715 is coupled to ground via constant current source 725. Similarly, AC signal source 790 is coupled to the source of P-channel transistor 715 and amplification stage 710 is coupled to the drain of P-channel transistor 715. Also, the input of amplification stage 705 is coupled to the source of P-channel transistor 715 and the output of amplification stage 705 is coupled to the gate of P-channel transistor 715.

Furthermore, amplification stages 705 and 710 may be implemented using N-channel transistors, as in the case of amplification stages 105 and 110, or may be implemented using P-channel transistors. Those skilled in art will easily be able to implement amplification stages 705 and 710 using P-channel transistors. Hence, no additional detail is necessary.

Although the present invention has been described in detail, those skilled in the art should understand that they can make various changes, substitutions and alterations herein without departing from the spirit and scope of the invention in its broadest form.

What is claimed is:

1. An operational amplifier, comprising:
an active virtual input providing low input impedance and receiving an input current;
a high impedance point receiving the input current from the input, providing a large open loop direct current gain, and producing a voltage; and
a transconductance output stage buffering the voltage produced at the high impedance point and biased by an external resistive load.

2. The operational amplifier oc claim 1, including an amplifier stage coupled between said active virtual ground input and said high impedance point.

3. The operational amplifier of claim 2, including one of an N-channel transistor and a P-channel transistor coupled between said amplifier stage and said high impedance point.

4. The operational amplifier of claim 3, wherein said transistor has a gate coupled to said amplifier stage, a drain coupled to said high impedance point, and a source coupled to said active virtual ground input.

5. An operational amplifier, comprising:
a first N-channel transistor having a gate, a drain and a source;
a node for connection to a reference potential;
a first current source coupled between said node and said source of said first N-channel transistor;
a first amplifier stage having an input coupled to said source of said first N-channel transistor and having an output coupled to said gate of said first N-channel transistor; and
a second amplifier stage having an input coupled to said drain of said first N-channel transistor.

6. The operational amplifier of claim 5, including a further node for connection to a positive power supply, and a second current source coupled between said further node and said drain of said first N-channel transistor.

7. The operational amplifier of claim 6, wherein said first amplifier stage is an inverting amplifier stage that includes a second N-channel transistor having a gate coupled to said source of said first N-channel transistor, having a source coupled to said reference potential node, and having a drain that defines said output of said first amplifier stage.

8. The operational amplifier of claim 7, including a third current source coupled to said drain of said of said second N-channel transistor.

9. The operational amplifier of claim 8, including a fourth current source, said second amplifier stage including a third N-channel transistor having a gate that defines said input of said second amplifier stage, having a source coupled to said fourth current source, and having a drain coupled to said positive power supply node.

10. The operational amplifier of claim 9, wherein said second amplifier stage includes a fourth N-channel transistor having a gate coupled to said source of said third N-channel transistor, having a source coupled to said reference potential node, and having a drain which defines an output of said second amplifier stage.

11. An operational amplifier, comprising:
a P-channel transistor having a gate, a drain, and a source;
a node for connection to a positive power supply;
a first current source coupled between said node and said source of said P-channel transistor;
a first amplifier stage having an input coupled to said source of said P-channel transistor and having an output coupled to said gate of said P-channel transistor; and
a second amplifier stage having an input coupled to said drain of said P-channel transistor.

12. The operational amplifier of claim 11, including a further node for connection to a reference potential, and a second current source coupled between said further node and said drain of said P-channel transistor.

13. An electrical signal frequency filter, comprising:
an N-channel transistor having a gate, a drain and a source;
a node for connection to a reference potential;
a current source coupled between said node and said source of said N-channel transistor;
a first amplifier stage having an input coupled to said source of said N-channel transistor and having an output coupled to said gate of said N-channel transistor;

a second amplifier stage having an input coupled to said drain of said N-channel transistor and having an output; and a capacitor coupled between said input of said second amplifier stage and said output of said second amplifier stage.

14. The filter of claim 13, provided as a low pass filter.

15. The filter of claim 14, including a resistor coupled between said source of said N-channel transistor and said output of said second amplifier stage.

16. The filter of claim 15, wherein said N-channel transistor, said node, said current source, and said first and second amplifier stages constitute an operational amplifier, and wherein said resistor and said capacitor are cooperable for establishing a unity gain frequency of said operational amplifier that is less than twice a cutoff frequency of said low pass filter.

17. An electrical signal frequency filter, comprising:

a P-channel transistor having a gate, a drain, and a source;

a node for connection to a positive power supply;

a current source coupled between said node and said source of said P-channel transistor;

a first amplifier stage having an input coupled to said source of said P-channel transistor and having an output coupled to said gate of said P-channel transistor;

a second amplifier stage having an input coupled to said drain of said P-channel transistor, and having an output; and a capacitor coupled between said input of said second amplifier stage and said output of said second amplifier stage.

18. The filter of claim 17, provided as a low pass filter.

19. The filter of claim 18, including a resistor coupled between said source of said P-channel transistor and said output of said second amplifier stage.

20. The filter of claim 19, wherein said P-channel transistor, said node, said current source, and said first and second amplifier stages constitute an operational amplifier, and wherein said resistor and said capacitor are cooperable for establishing a unity gain frequency of said operational amplifier that is less than twice a cutoff frequency of said low pass filter.

* * * * *

UNITED STATES PATENT AND TRADEMARK OFFICE
CERTIFICATE OF CORRECTION

PATENT NO. : 6,937,104 B1
DATED : August 30, 2005
INVENTOR(S) : Devnath Varadarajan and Laurence D. Lewicki

It is certified that error appears in the above-identified patent and that said Letters Patent is hereby corrected as shown below:

Column 4,
Line 11, delete "CL" and replace with -- Cf --;
Line 14, delete "12" and replace with -- I2 --;
Line 47, delete "rds=/1/gds" and replace with -- rds=1/gds --;

Column 8,
Line 62, delete "oc" and replace with -- of --.

Signed and Sealed this

Thirtieth Day of May, 2006

JON W. DUDAS
*Director of the United States Patent and Trademark Office*